United States Patent
Wang et al.

(10) Patent No.: US 10,037,990 B2
(45) Date of Patent: Jul. 31, 2018

(54) METHOD OF MANUFACTURING INTERCONNECT LAYER AND SEMICONDUCTOR DEVICE WHICH INCLUDES INTERCONNECT LAYER

(71) Applicant: TAIWAN SEMICONDUCTOR MANUFACTURING COMPANY, LTD., Hsinchu (TW)

(72) Inventors: Chin-Shan Wang, Hsinchu (TW); Shun-Yi Lee, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/255,394

(22) Filed: Sep. 2, 2016

(65) Prior Publication Data

US 2018/0006017 A1    Jan. 4, 2018

Related U.S. Application Data

(60) Provisional application No. 62/357,472, filed on Jul. 1, 2016.

(51) Int. Cl.
*H01L 27/06* (2006.01)
*H01L 23/528* (2006.01)
(Continued)

(52) U.S. Cl.
CPC ...... *H01L 27/0629* (2013.01); *H01L 21/8221* (2013.01); *H01L 21/8234* (2013.01);
(Continued)

(58) Field of Classification Search
CPC . H01L 27/0629; H01L 28/24; H01L 23/5283; H01L 23/535; H01L 21/8221;
(Continued)

(56) References Cited

U.S. PATENT DOCUMENTS 5,616,951 A    4/1997 Liang
6,329,234 B1   12/2001 Ma et al.
(Continued)

*Primary Examiner* — Lex Malsawma
*Assistant Examiner* — Gardner W Swan
(74) *Attorney, Agent, or Firm* — Hauptman Ham, LLP

(57) ABSTRACT

A semiconductor device includes an interconnect layer on an inter-layer dielectric (ILD) structure. The ILD structure includes: first contacts, extending through the ILD structure, electrically connected to corresponding first components located in a floor structure underlying the ILD structure; at least one second component located within the ILD structure and spaced from a surface of the ILD structure (in a direction perpendicular to a plane of the ILD structure) a distance which is less than a thickness of the ILD structure; and second contacts directly contacting corresponding first regions of the at least one second component. The interconnect layer includes: first metallization segments which directly contact corresponding ones of the first contacts; and second metallization segments located over a second region of the at least one second component, a width of the second metallization segments being less than a width of the first metallization segments.

20 Claims, 11 Drawing Sheets

(51) Int. Cl.
*H01L 21/822* (2006.01)
*H01L 21/8234* (2006.01)
*H01L 23/535* (2006.01)
*H01L 49/02* (2006.01)
*H01L 29/06* (2006.01)
*H01L 21/768* (2006.01)

(52) U.S. Cl.
CPC ........ *H01L 23/5283* (2013.01); *H01L 23/535* (2013.01); *H01L 28/24* (2013.01); *H01L 29/0649* (2013.01); *H01L 21/7684* (2013.01); *H01L 21/76802* (2013.01); *H01L 21/76877* (2013.01)

(58) Field of Classification Search
CPC ........... H01L 21/8234; H01L 21/76895; H01L 29/0649
See application file for complete search history.

(56) References Cited

U.S. PATENT DOCUMENTS

| | | | |
|---|---|---|---|
| 7,354,856 B2 | 4/2008 | Yeh et al. | |
| 8,222,139 B2 | 7/2012 | Chen et al. | |
| 8,621,406 B2 | 12/2013 | Lei et al. | |
| 8,847,320 B2 | 9/2014 | Chen | |
| 8,952,547 B2 | 2/2015 | Liaw | |
| 2006/0181388 A1* | 8/2006 | Chinthakindi | H01C 7/006 338/309 |
| 2011/0291231 A1* | 12/2011 | Jiang | H01L 23/5227 257/531 |
| 2013/0121057 A1* | 5/2013 | Le Neel | G11C 13/0069 365/148 |
| 2014/0062641 A1* | 3/2014 | Chen | H01L 23/5227 336/188 |
| 2014/0210014 A1 | 7/2014 | Ma et al. | |
| 2015/0179573 A1 | 6/2015 | Hsu et al. | |
| 2015/0187632 A1* | 7/2015 | Ali | H01L 23/5228 257/537 |

\* cited by examiner

METHOD OF MANUFACTURING INTERCONNECT LAYER AND SEMICONDUCTOR DEVICE WHICH INCLUDES INTERCONNECT LAYER

BACKGROUND

The semiconductor integrated circuit (IC) industry has experienced rapid growth. In the course of IC evolution, functional density (the number of interconnected devices per chip area) has generally increased while geometry size (the smallest component (or line) that can be created using a fabrication process) has decreased. In addition to providing benefits, this scaling down process has increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Moreover, the dimensions of the various features may be arbitrarily increased or reduced for clarity of discussion.

DETAILED DESCRIPTION

Figure 1A:
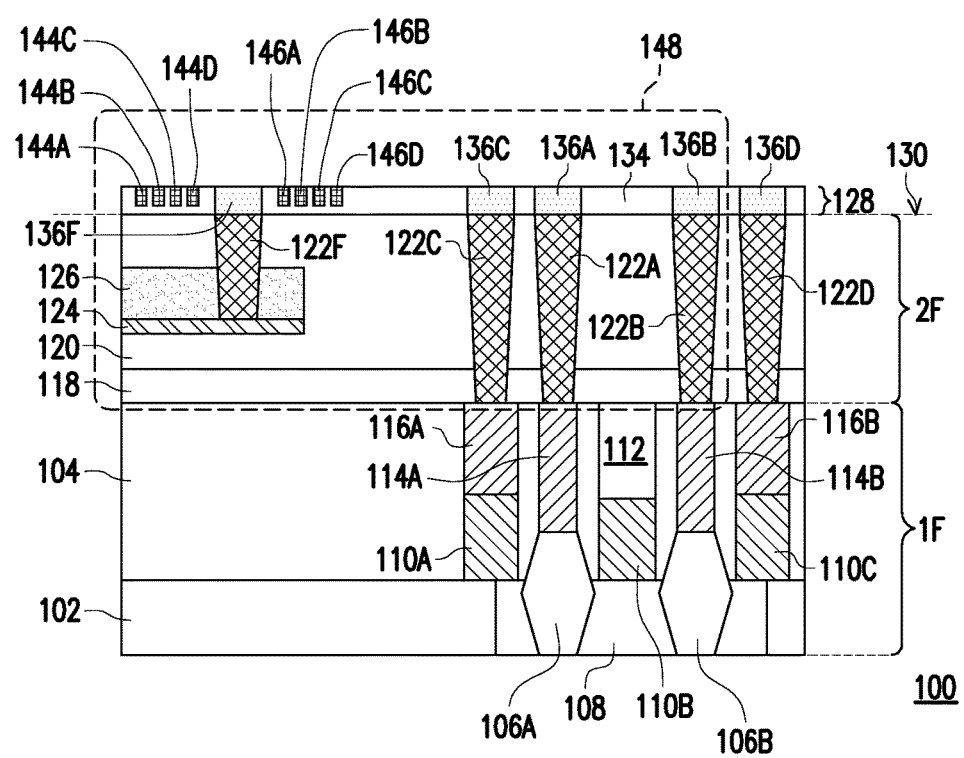
FIG. 1A is a cross-section of an intermediate structure corresponding to a stage in the manufacture of a semiconductor device in accordance with at least one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term mask, photolithographic mask, photomask and reticle are used to refer to the same item.

The present disclosure relates to using metal-line formation techniques to control various thicknesses (in a vertical/stacking direction) of line segments of a given interconnect layer in order to reduce a risk of dielectric breakdown in selected areas. More particularly, where an area of a semiconductor device includes a conductive structure separated in a vertical/stacking direction from one or more overlying and/or underlying metal line segments which are not electrically connected to the conductive structure, the present disclosure generally relates to using metal-line formation techniques to replace a given thicker and wider line segment with plural correspondingly thinner and narrower line segments in order to increase vertical separation distance and thereby reduce the risk of dielectric breakdown.

FIG. 1A is a cross-section of an intermediate structure 100 corresponding to a stage in the manufacture of a semiconductor device in accordance with at least one embodiment of the present disclosure.

Figure 1B:
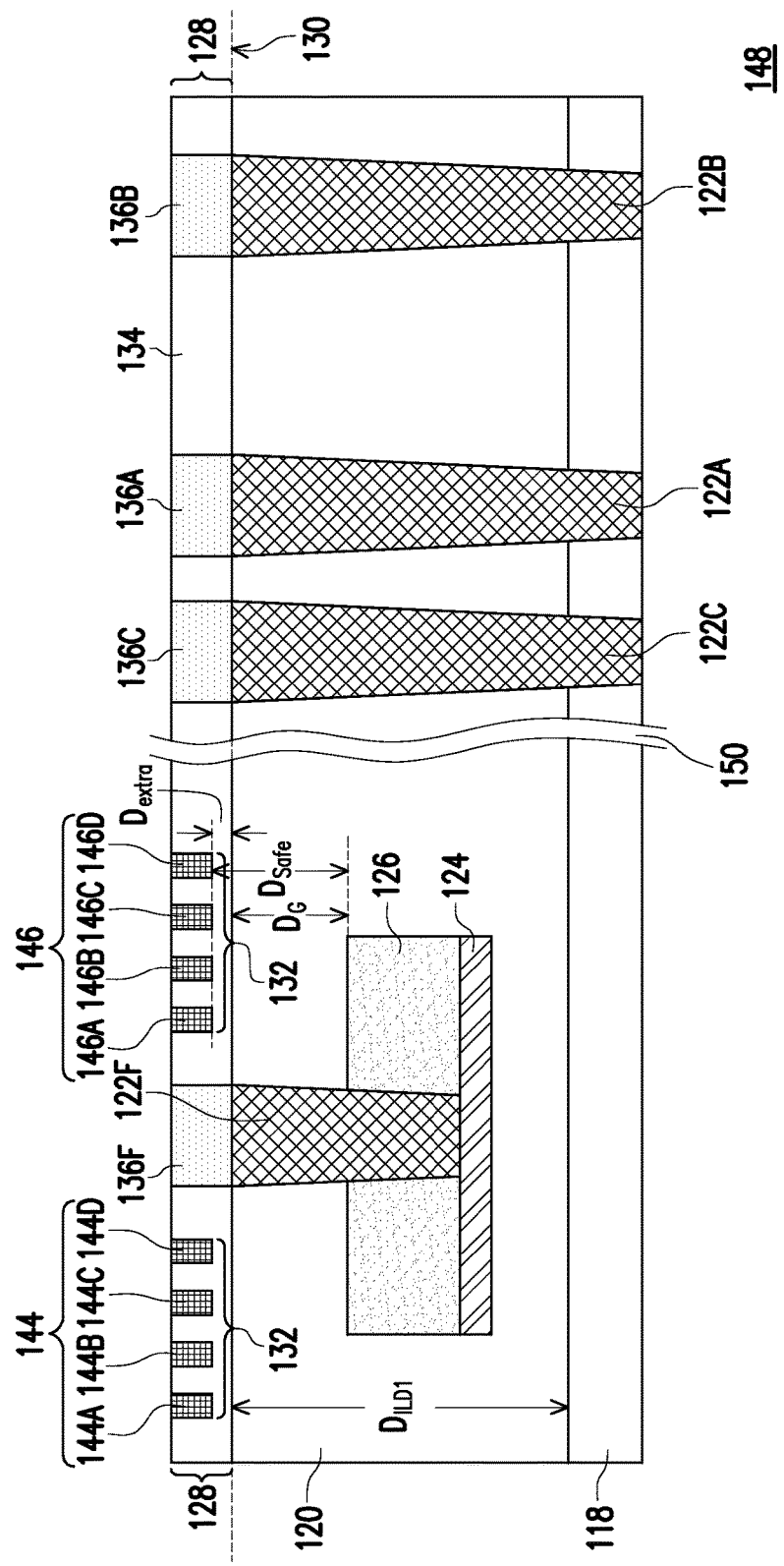
FIG. 1B is an enlarged view of a portion of the cross-section of FIG. 1A in accordance with at least one embodiment of the present disclosure.

FIG. 1B is an enlarged view of a portion 148 of the cross-section of FIG. 1A in accordance with at least one embodiment of the present disclosure. A break in the depiction of components of portion 148 is indicated by a reference numeral 150.

Figure 1C:
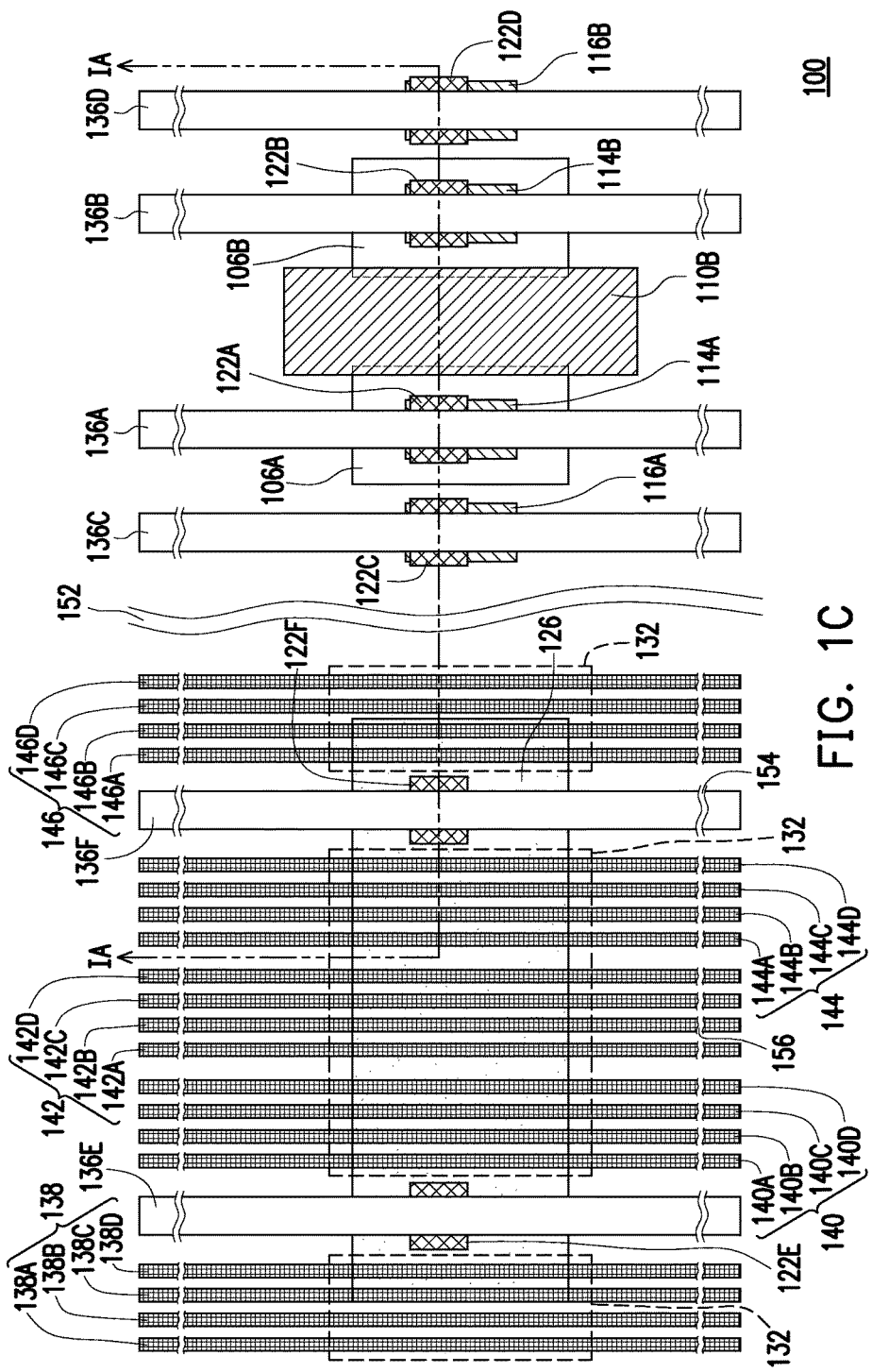
FIG. 1C is a plan view of the semiconductor device of FIGS. 1A-1B (wherein FIG. 1A is a cross-section taken along section-line IA-IA in FIG. 1C) in accordance with at least one embodiment of the present disclosure.

FIG. 1C is a plan view of the semiconductor device of FIGS. 1A-1B (of which FIG. 1A is a cross-section taken along section-line IA-IA) in accordance with at least one embodiment of the present disclosure. Breaks in the depiction of components of structure 100 are indicated by reference numerals 152, 154 and 156.

Turning to FIG. 1A, intermediate structure 100 is arranged as a stack of structures which includes: a 'first floor' structure 1F; a 'second floor' structure 2F formed on first floor structure 1F; and an interconnect layer 128 formed on second floor structure 2F. In some embodiments, intermediate structure 100 is formed on a substrate (not shown in the FIGS.). In some embodiments, the substrate is a semiconductor. In some embodiments, the semiconductor substrate is silicon, silicon germanium or gallium arsenide. In some embodiments, the substrate is a silicon on insulator (SOI) structure or a germanium on insulator (GeOI) structure.

First floor structure 1F includes: a relatively lightly doped semiconductor region 108 bounded by shallow trench isolation (STI) regions 102; and a first interlayer dielectric structure (ILD0) 104 formed on STI regions 102 and region 108. Formed within and extending above region 108 (into ILD0 104) are relatively heavily doped source/drain regions 106A and 106B. Formed on region 108 (and in ILD0 104) and between source/drain regions 106A and 106B is a conductive plug 110B representing a gate. Together, region 108, source/drain regions 106A and 106B, and gate 110B form a transistor. Source/drain regions 106A and 106B are examples of a first component. As used herein, a first component is one in which at least a majority of the component is located outside of an ILD structure.

In some embodiments, the transistor is a MOSFET. In some embodiments, the transistor is an n-type MOSFET (or nMOSFET) for which source/drain regions 106A and 106B are relatively heavily doped with one or more n-type dopants and region 108 is relatively lightly doped with one or more n-type dopants such that an n-type channel is induced in the portion of region 108 between source/drain regions 106A and 106B. In some embodiments, the transistor is an p-type MOSFET (or pMOSFET) for which source/drain regions 106A and 106B are relatively heavily doped with one or more p-type dopants and region 108 is relatively lightly doped with one or more p-type dopants such that an p-type channel is induced in the portion of region 108 between source/drain regions 106A and 106B. In some embodiments, gate 110B is a metal gate. In some embodiments, source/drain regions 106A and 106B are relatively heavily doped epitaxially grown silicon.

First floor structure 1F further includes: a conductive plug 110A located in ILD0 104 and partially on region 108 on a side of source/drain region 106A opposite to gate 110B; and a conductive plug 110C located in ILD0 104 and partially on region 108 on a side of source/drain region 106B opposite to gate 110B.

First floor structure 1F yet further includes: a hard mask 112 located in ILD0 104 and formed on gate 110B; conductive plugs 114A and 114B located in ILD0 104 and correspondingly formed on conductive source/drain regions 106A and 106B; and conductive plugs 116A and 116B located in ILD0 104 and correspondingly formed on conductive plugs 110A and 110C.

In some embodiments, gate 110B and conductive plugs 110A and 110C are formed of metal. In some embodiments, gate 110B and conductive plugs 110A and 110C are formed of the same metal. In some embodiments, ILD0 104 is silicon nitride. In some embodiments, ILD0 104 is formed of Si3N4.

Second floor structure 2F includes: an etch stop layer (ESL) 118; and a second interlayer dielectric structure (ILD1) 120 formed on ESL 118. There is an interface 130 between ILD1 120 and interconnect layer 128. Structures extending through ILD1 120 include: conductive plugs 122C, 122A, 122B and 122D correspondingly formed on conductive plugs 116A, 114A, 114B and 116B. Conductive plugs 122A and 122B extend through ILD1 120, and are electrically connected via corresponding conductive plugs 114A and 114B to corresponding first components, namely source/drain regions 106A and 106B.

In some embodiments, conductive plugs 122C, 122A, 122B and 122D are formed of metal. In some embodiments, conductive plugs 122C, 122A, 122B and 122D are formed of the same metal. In some embodiments, ILD1 120 is silicon nitride. In some embodiments, ILD1 120 is formed of Si3N4.

Structures formed within ILD1 120 further include: a dielectric layer 124; a conductive plate 126 formed on dielectric layer 124; and conductive plugs 122E and 122F formed on regions of conductive plate 126 and extending to interface 130.

Turning to FIG. 1B, dielectric layer 124 and conductive plate 126 are located in a middle region of ILD1 120. In some embodiments, a horizontal direction is defined as being parallel to the plane of ILD1 120 such that: ILD1 120 has a thickness (in a vertical/stacking direction) of $D_{ILD1}$; an upper surface of conductive plate 126 is located a gap distance $D_G$ (in a vertical/stacking direction) from interface 130; and $D_G<D_{ILD1}$. Conductive plate 126 is an example of a second component. As used herein, a second component is a component, the majority (if not all) of which is enclosed within an interlayer dielectric structure. Conductive plugs 122E (FIG. 1C) and 122F extend downward from interface 130 so as to directly contact corresponding first regions of the second component, namely conductive plate 126.

In some embodiments, conductive plate 126 is a high resistance component. In some embodiments, conductive plate 126 is a resistor. In some embodiments, conductive plate 126 is formed of titanium nitride. In some embodiments, conductive plate 126 includes multiple conductive layers. Greater detail regarding the manufacture of conductive plate 126 is found in U.S. Pre-Grant Patent Publication No. 20140210014 (hereinafter "PGPub '014") published Jul. 31, 2014, and in U.S. Pre-Grant Patent Publication No. 20150179573 (hereinafter "PGPub '573") published Jun. 25, 2015, the entireties of each of which are hereby incorporated by reference.

Interconnect layer 128 includes a dielectric layer 134 in which are formed regular line segments S0 136A, 136B, 136C, 136E and 136F. Regular line segments S0 136A, 136B, 136C, 136E and 136F are correspondingly formed on conductive plugs 122A, 122B, 122C, 122E and 122F. Line segment S0 136A is electrically connected to source/drain 106A via conductive plugs 122A and 114A. In some embodiments, regular line segments S0 136A, 136B, 136C, 136E and 136F are the same thickness as the thickness (in the vertical/stacking direction) of dielectric layer 134. In some embodiments, regular line segments S0 136A, 136B, 136C, 136E and 136F are each the same width (in the horizontal direction).

Line segment S0 136B is electrically connected to source/drain 106B via conductive plugs 122B and 114B. Line segment S0 136C is electrically connected to conductive plugs 122C, 116A and 110A. However, conductive plug 110A is electrically connected to conductive plug 116A and not to a corresponding conductive structure in region 108 (e.g., is not electrically connected to source/drain 106A) such that the conductive path which includes conductive plugs 122C, 116A and 110A is regarded as a 'dummy' conductive path. Line segment S0 136D is electrically connected to conductive plugs 122D, 116B and 110C. However, conductive plug 122B is electrically connected to conductive plug 116B and not to a corresponding conductive structure in region 108 (e.g., is not electrically connected to source/drain 106B) such that the conductive path which includes conductive plugs 122D, 116B and 110C is regarded as a 'dummy' conductive path.

Regular line segment S0 136E is electrically connected to conductive plate 126 by conductive plug 122E (FIG. 1C). Regular line segment S0 136F is electrically connected to conductive plate 126 by conductive plug 122F. As such, regular line segments S0 136E and 136F represent portions of a first conductive path.

Interconnect layer 128 further includes sets of M smaller line segments S0', wherein each smaller line segment S0' is thinner and narrower than a regular line segment S0, and wherein M is an integer and 2≤M. As shown in FIGS. 1A-1C, M=4. In some embodiments, M takes on other integer values. In some embodiments, each regular line segment S0 is about four times wider than each smaller line segment S0' such that: a given set of smaller line segments S0' includes four smaller line segments S0'; and $w_{s0} \approx 4*w_{s0'}$ where $w_{s0}$ is the width of regular line segment S0 and where $w_{s0'}$ is the width of smaller line segment S0'. In some embodiments, some or all of regular line segments S0 136A, 136B, 136C, 136E and 136F are thinner than the thickness of dielectric layer 134, albeit a thinnest one of regular line segments S0 136A, 136B, 136C, 136E and 136F still being thicker than a thickest one of smaller line segments S0'. In some embodiments, some or all of regular line segments S0 136A, 136B, 136C, 136E and 136F are of different widths, albeit a narrowest one of regular line segments S0 136A, 136B, 136C, 136E and 136F still being wider than a widest one of smaller line segments S0'.

In some embodiments, for each smaller line segment S0', a thickness/height ($h_{s0'}$) of the smaller line segment S0' relates to a width ($w_{s0'}$) of the smaller line segment S0' as follows:

$$h_{s0'} \propto 1/w_{s0'}$$

More particularly, thickness/height $h_{s0'}$ relates to width $w_{s0'}$ as follows:

$$h_{s0'} = \beta * w_{s0'}$$

where β is a positive real number, and where ($\approx 1.5$)≤β≤ ($\approx 2.0$).

For simplicity of illustration, three sets of four smaller line segments S0' are shown in FIG. 1C as being formed between regular line segments S0 136E and 136F, wherein: a first set 140 includes smaller line segments S0' 140A, 140B, 140C and 140D; a second set 142 includes smaller line segments S0' 142A, 142B, 142C and 142D; and a third set 144 includes smaller line segments S0' 144A, 144B, 144C and 144D. In some embodiments, greater or fewer than four smaller line segments S0' are in some or all of the sets of smaller line segments. In some embodiments, other numbers of sets of smaller line segments are formed between regular line segments S0 136E and 136F. In some embodiments, at least one other set 146 of smaller line segments S0' is formed between regular line segments S0 136F and 136C including smaller line segments S0' 146A, 146B, 146C and 146D. In some embodiments, at least one other set 138 of smaller line segments S0' 138A, 138B, 138C and 138D is formed to a side of regular line segment S0 136E that is opposite to the side on which the first set 140 of smaller line segments S0' 140A, 140B, 140C and 140D is located.

In some embodiments, within a given set of smaller line segments S0', each of the smaller line segment S0' members represent the same conductive path, e.g., within smaller line segment set 144, each of smaller line segments S0' 144A, 144B, 144C and 144D represents the same conductive path. In some embodiments, each of sets 138, 140, 142, 144 and 146 of smaller line segments S0' represents a different conductive path than the first conductive path that includes regular line segments S0 136E and 136F. In some embodiments, sets 138, 140, 142, 144 and 146 of smaller line segments S0' represent correspondingly different second through sixth conductive paths relative to each other as well as relative to the first conductive path that includes regular line segments S0 136E and 136F.

If each of sets 138, 140, 142, 144 and 146 were to be replaced by instances of regular line segment S0, then areas 132 would be at risk for dielectric breakdown (e.g., a short circuit) because gap distance $D_G$ is insufficient to prevent dielectric breakdown between such regular line segments S0 and conductive plate 126. However, because each of smaller segments S0' 138A-138D, 140A-140D, 142A-142D, 144A-144D, and 146A-146D is narrower in width than an instance of regular segment S0 but also thinner in thickness, there is an extra amount of distance $D_{extra}$ between bottom surfaces of smaller segments S0' 138A-138D, 140A-140D, 142A-142D, 144A-144D, and 146A-146D and the top surface of ILD1 120. Together, a thickness of the portion of dielectric layer 134 under a given one of smaller segments S0' (equal to extra distance $D_{extra}$) plus a thickness of ILD1 120 (equal to gap distance $D_G$) sum to a safe distance $D_{safe}$ that is sufficient to reduce dielectric breakdown between the given smaller segment S0' and conductive plate 126. In some embodiments, distance $D_{safe}$ is sufficient to eliminate dielectric breakdown.

Alternatively, if one or more but less than all of sets 138, 140, 142, 144 and 146 were to be replaced by instances of regular line segment S0, then corresponding regions of areas 132 in which a regular line segment S0 had been replaced by a set of smaller line segments S0' would be at risk for dielectric breakdown (e.g., a short circuit) because a thickness of ILD1 120 equal to gap distance $D_G$ in the corresponding regions is insufficient to prevent dielectric breakdown. However, because each of the one or more but less than all of the corresponding smaller segments S0' 138A-138D, 140A-140D, 142A-142D, 144A-144D, and 146A-146D is narrower in width than an instance of regular segment S0 but also thinner in thickness, there is an extra amount of distance $D_{extra}$ between bottom surfaces of the corresponding smaller segments S0' 138A-138D, 140A-140D, 142A-142D, 144A-144D, and 146A-146D and the top surface of ILD1 120. Accordingly, a thickness of the portion of dielectric layer 134 under a given one of the smaller segments S0' (equal to extra distance $D_{extra}$) plus a thickness of ILD1 120 (equal to gap distance $D_G$) sum to a safe distance $D_{safe}$ that is sufficient to reduce dielectric breakdown in the corresponding regions. In some embodiments, distance $D_{safe}$ is sufficient to eliminate dielectric breakdown in the corresponding regions.

Figure 2A:
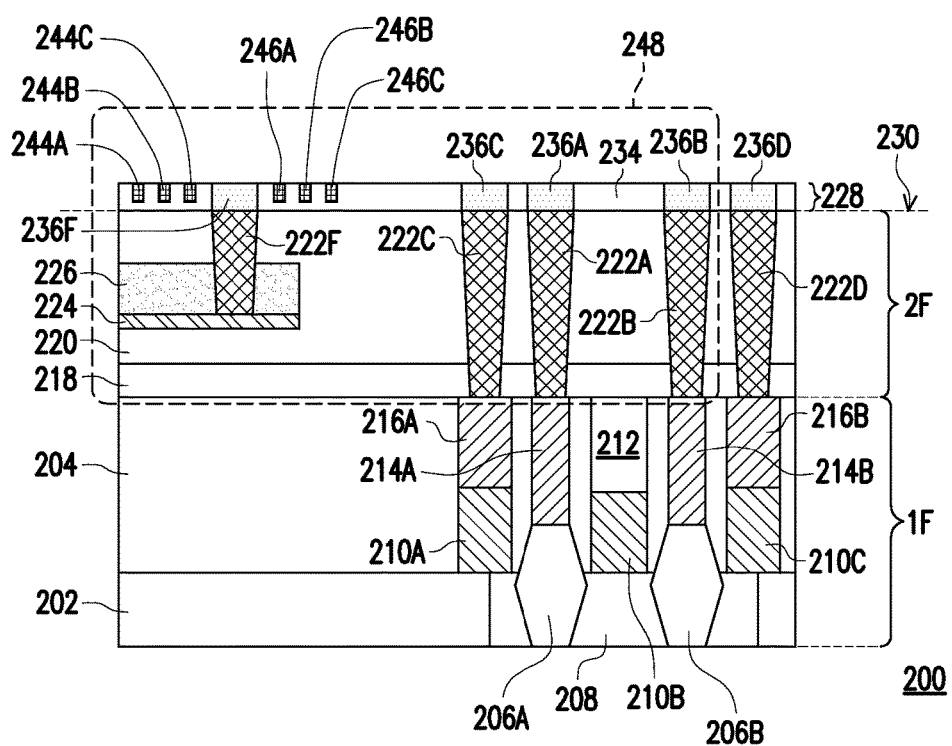
FIG. 2A is a cross-section of an intermediate structure corresponding to a stage in the manufacture of a semiconductor device in accordance with at least one embodiment of the present disclosure.

FIG. 2A is a cross-section of a stage in the manufacture of a semiconductor device in accordance with at least one embodiment of the present disclosure.

Figure 2B:
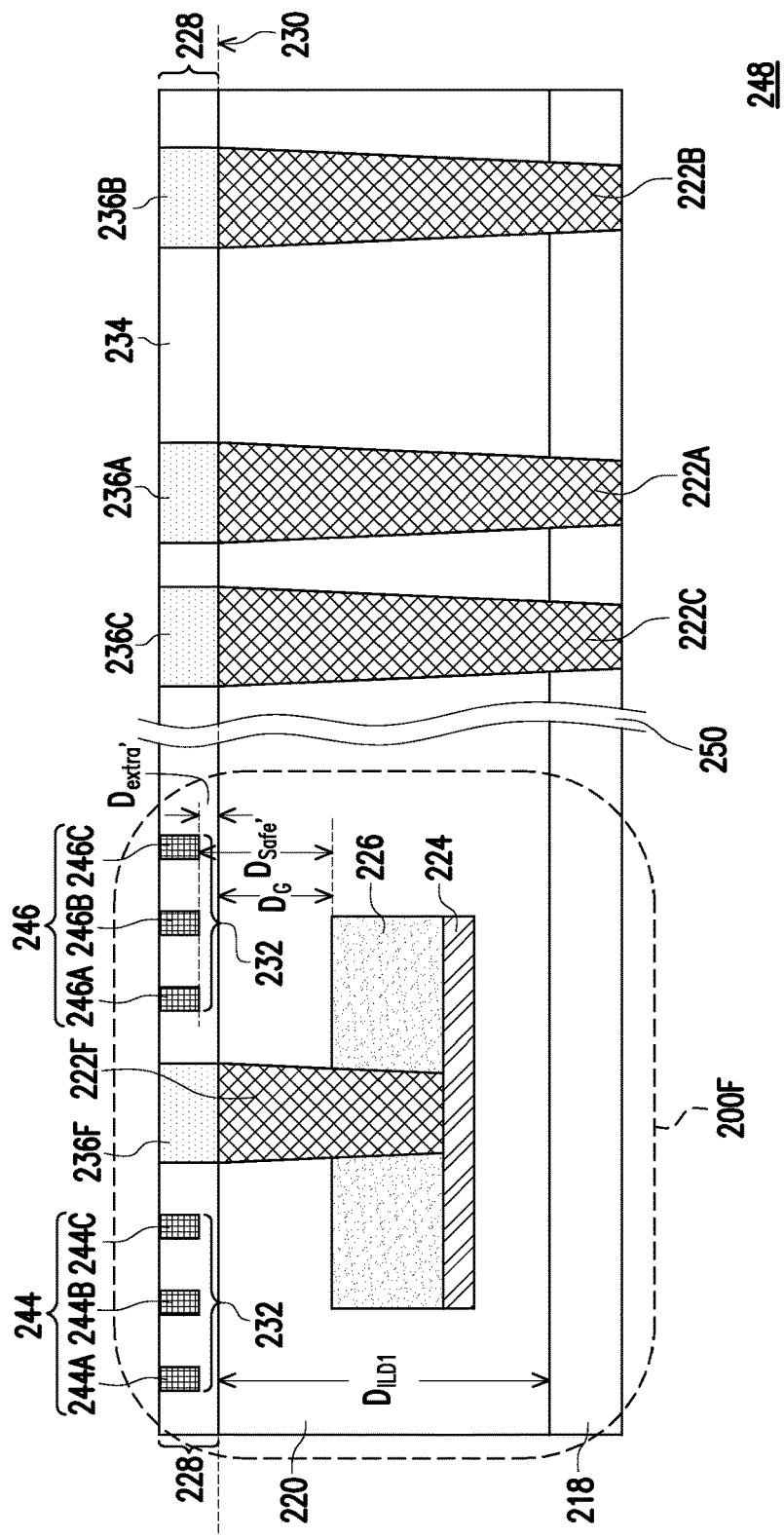
FIG. 2B is an enlarged view of a portion of the cross-section of a portion of FIG. 2A in accordance with at least one embodiment of the present disclosure.

FIG. 2B is an enlarged view of a portion 248 of the cross-section of FIG. 2A in accordance with at least one embodiment of the present disclosure. A break in the depiction of components of portion 248 is called out with reference numeral 250.

Figure 2C:
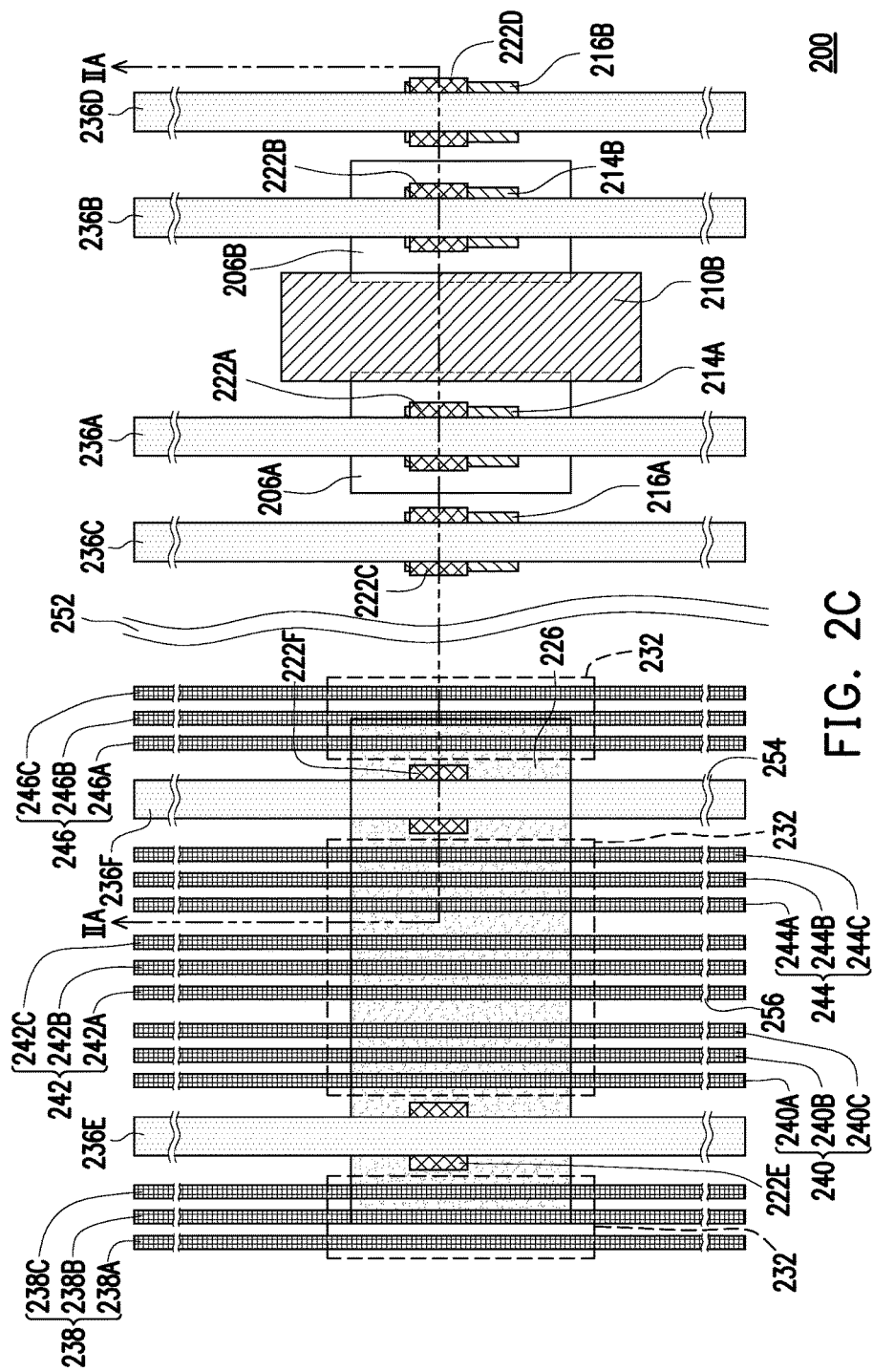
FIG. 2C is a plan view of the semiconductor device of FIGS. 2A-2B (wherein FIG. 2A is a cross-section taken along section-line IIA-IIA in FIG. 2C) in accordance with at least one embodiment of the present disclosure.

FIG. 2C is a plan view of the semiconductor device of FIGS. 2A-2B (wherein FIG. 2A is a cross-section taken along section-line IIA-IIA in FIG. 2C) in accordance with at least one embodiment of the present disclosure. Breaks in the depiction of components of structure 200 are indicated by reference numerals 252, 254 and 256.

FIGS. 2A-2C are similar to FIGS. 1A-1C. Reference numerals in FIGS. 2A-2C correspond to reference numerals in FIGS. 1A-1C albeit increased by 100. For the sake of brevity of description, this discussion will focus on differences between FIGS. 2A-2C and FIGS. 1A-1C. For example, conductive plug 122F is in FIGS. 1A-C and is described, whereas corresponding conductive plug 222F is in FIGS. 2A-2C but is not described.

More particularly, FIGS. 2A-2C include an interconnect layer 228 rather than interconnect layer 128 (FIGS. 1A-1C). Accordingly, FIGS. 2A-2C further include an interface 230 between ILD1 220 and interconnect layer 228 rather than an interface 130 between ILD1 120 and interconnect layer 128 (FIGS. 1A-1C).

Interconnect layer 228 further includes sets of N smaller line segments S0", wherein each smaller line segment S0" is thinner in thickness and narrower in width than a regular line segment S0, and wherein N is an integer and 2≤N. As shown in FIGS. 2A-2C, N=3. In some embodiments, N takes on other integer values. By contrast, each set of smaller line segments S0' shown in FIGS. 1A-1C includes M smaller segments, where M is shown as M=4.

In some embodiments, each regular line segment S0 is about three times wider than each smaller line segment S0" such that: a given set of smaller line segments S0" includes three smaller line segments S0"; and $w_{s0} \approx 3*w_{s0"}$, where $w_{s0}$ is the width of regular line segment S0 and where $w_{s0"}$ is the width of smaller line segment S0".

In some embodiments, for each smaller line segment S0", a thickness/height ($h_{s0"}$) of the smaller line segment S0" relates to a width ($w_{s0"}$) of the smaller line segment S0" as follows:

$$h_{s0"} \propto 1/w_{s0"}$$

More particularly, thickness/height $h_{s0"}$ relates to width $w_{s0"}$ as follows:

$$h_{s0"} = \beta * w_{s0"}$$

where β is a positive real number, and where (≈1.5)≤β≤(≈2.0).

For simplicity of illustration, three sets of three smaller line segments S0" are shown in FIGS. 2A-2C as being formed between regular line segments S0 236E and 236F, wherein: a first set 240 includes smaller line segments S0" 240A, 240B and 240C; a second set 242 includes smaller line segments S0" 242A, 242B and 242C; and a third set 244 includes line smaller segments S0" 244A, 244B and 244C. In some embodiments, greater or fewer than three smaller line segments S0" are in some or all of the sets of smaller line segments. In some embodiments, other numbers of sets of smaller line segments are formed between regular line segments S0 236E and 236F. In some embodiments, at least one other set 246 of smaller line segments S0" is formed between regular line segments S0 236F and 236C including smaller line segments S0" 246A, 246B and 246C. In some embodiments, at least one other set 238 of smaller line segments S0" 238A, 238B and 238C is formed to a side of regular line segment S0 236E that is opposite to the side on which is located the first set 240 of smaller line segments S0" 240A, 240B and 240C.

In some embodiments, within a given set of smaller line segments S0", each of the smaller line segment S0" members represent the same conductive path, e.g., within smaller line segment set 244, each of smaller line segments S0" 244A, 244B and 244C represents the same conductive path. In some embodiments, sets 238, 240, 242, 244 and 246 of smaller line segments S0" represent at least one different conductive path than the first conductive path that includes regular line segments S0 236E and 236F. In some embodiments, sets 238, 240, 242, 244 and 246 of smaller line segments S0" represent correspondingly different second through sixth conductive paths relative to each other as well as relative to the first conductive path that includes regular line segments S0 236E and 236F.

If each of sets 238, 240, 242, 244 and 246 were to be replaced by instances of regular line segment S0, then areas 232 would be at risk for dielectric breakdown (e.g., a short circuit) because gap distance $D_G$ is insufficient to prevent dielectric breakdown between such regular line segments S0 and conductive plate 226. However, because each of smaller segments S0" 238A-238C, 240A-240C, 242A-242C, 244A-244C, and 246A-246C is narrower in width than an instance of regular segment S0 but also thinner in thickness, there is an extra amount of distance $D_{extra'}$ between bottom surfaces of smaller segments S0" 238A-238C, 240A-240C, 242A-242C, 244A-244C, and 246A-246C and the top surface of ILD1 220. Together, a thickness of the portion of dielectric layer 234 under a given one of the smaller segments S" (equal to extra distance $D_{extra'}$) plus a thickness of ILD1 220 (equal to gap distance $D_G$) sum to a safe distance $D_{safe'}$ that is sufficient to reduce dielectric breakdown. In some embodiments, distance $D_{safe'}$ is sufficient to eliminate dielectric breakdown.

Alternatively, if one or more but less than all of sets 238, 240, 242, 244 and 246 were to be replaced by instances of regular line segment S0, then corresponding regions of areas 232 in which a regular line segment S0 had been replaced by a set of smaller line segments S0" would be at risk for dielectric breakdown (e.g., a short circuit) because a thickness of ILD1 220 equal to gap distance $D_G$ in the corresponding regions is insufficient to prevent dielectric breakdown. However, because each of the one or more but less than all of the corresponding smaller segments S0" 238A-238C, 240A-240C, 242A-242C, 244A-244C, and 246A-246C is narrower in width than an instance of regular segment S0 but also thinner in thickness, there is an extra amount of distance $D_{extra'}$ between bottom surfaces of the corresponding smaller segments S0" 238A-238C, 240A-240C, 242A-242C, 244A-244C, and 246A-246C and the top surface of ILD1 220. Accordingly, a thickness of the portion of dielectric layer 234 under a given on of the smaller segments S0" (equal to extra distance $D_{extra'}$) plus a thickness of ILD1 220 (equal to gap distance $D_G$) sum to a safe distance $D_{safe'}$ that is sufficient to reduce dielectric breakdown in the corresponding regions. In some embodiments, distance $D_{safe'}$ is sufficient to eliminate dielectric breakdown in the corresponding regions.

In FIG. 2C, a portion of structure 220 is called out as a sub-structure 200F. A similar sub-structure 300F is shown in FIG. 3F.

FIGS. 3A-3F are cross-sections of an interconnect layer for a semiconductor device at various stages of manufacture in accordance with at least one embodiment of the present disclosure.

FIGS. 3A-3F are similar to portions of FIGS. 2A-2C. Reference numerals in FIGS. 2A-2C correspond to reference numerals in FIGS. 2A-2C albeit increased by 100. For the sake of brevity of description, this discussion will focus on differences between FIGS. 2A-2C and FIGS. 1A-1C. More particularly, FIGS. 3A-3F correspond to various stages in the manufacture of a sub-structure 300F (FIG. 3F), where sub-structure 300F includes a portion of ILD1 320 and a portion of an interconnect layer 328. Interconnect layer 328 is similar to interconnect layer 228 of FIGS. 2B-2C, and sub-structure 300F (FIG. 3F) is similar to a sub-structure 200F of interconnect layer 228 of FIGS. 2A-2C.

Figure 3A:
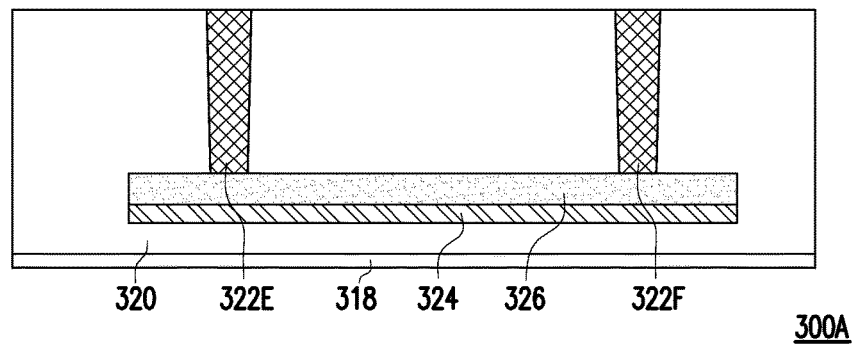
FIGS. 3A-3F are cross-sections of an interconnect layer for a semiconductor device at various stages in accordance with at least one embodiment of the present disclosure.

FIG. 3A is a cross-section of an inchoate version 300A of sub-structure 300F according to an embodiment. An inchoate version refers to a version which is not yet completed or fully developed. Interconnect layer 328 is formed (FIGS. 3B-3F) on ILD1 320. In some embodiments, interconnect layer 328 is formed using a Damascene technique.

Figure 3B:
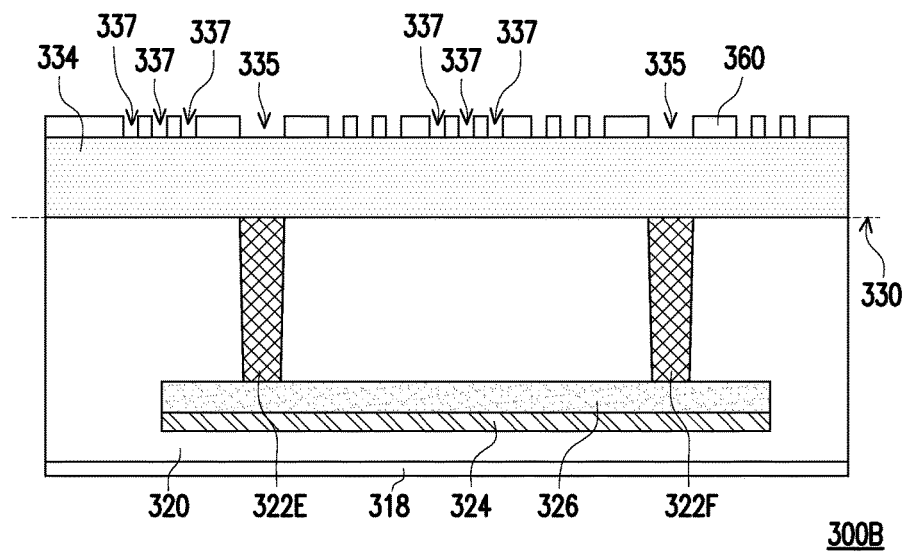

FIG. 3B is a cross-section of an inchoate version 300B of sub-structure 300F according to an embodiment. A dielectric layer 334 is deposited on ILD1 320. Then, dielectric layer 334 is subjected to a photolithography process. In some embodiments, a layer of negative photoresistive material is formed on dielectric layer 334. In some embodiments, the photoresistive material is formed using spin-coating. In some embodiments, the photoresist layer is soft-baked and then exposed to light (e.g., a deep ultraviolet (DUV) light) using a mask. In some embodiments, the exposed photoresist layer is subjected to post-exposure baking (PEB), developing, and hard baking thereby removing unexposed portions of the photoresist layer. As a result, exposed portions 360 of the photoresist layer remain on dielectric layer 334 as etch-mask features and regions 335 and 337 of dielectric layer 334 are exposed, thereby resulting in inchoate version 300B of sub-structure 300F, which includes an interface 330 between ILD1 320 and interconnect layer 328. Depending on the technology node, in some embodiments, a multi-masking technique (e.g., a dual-masking technique) is used to achieve the remaining portions 360 of the photoresist layer.

Like interconnect layer 228, interconnect layer 328 includes sets of smaller line segments S0", wherein each smaller line segment S0" is thinner in thickness and narrower in width than a regular line segment S0. More particularly (and, again, like interconnect layer 228), each set of smaller line segments S0" in interconnect layer 328 includes three line segments S0". Accordingly, each opening in the mask corresponding to a smaller line segment S0" is narrower than an opening corresponding to a regular mask segment S0. In some embodiments, the width $w_{s0}$ of the regular openings (corresponding to regular line segments S0) is about three times greater than the width $w_{s0''}$ of the narrow openings (corresponding to smaller line segments S0") such that $w_{s0} \approx 3 \cdot w_{s0''}$.

Figure 3C:
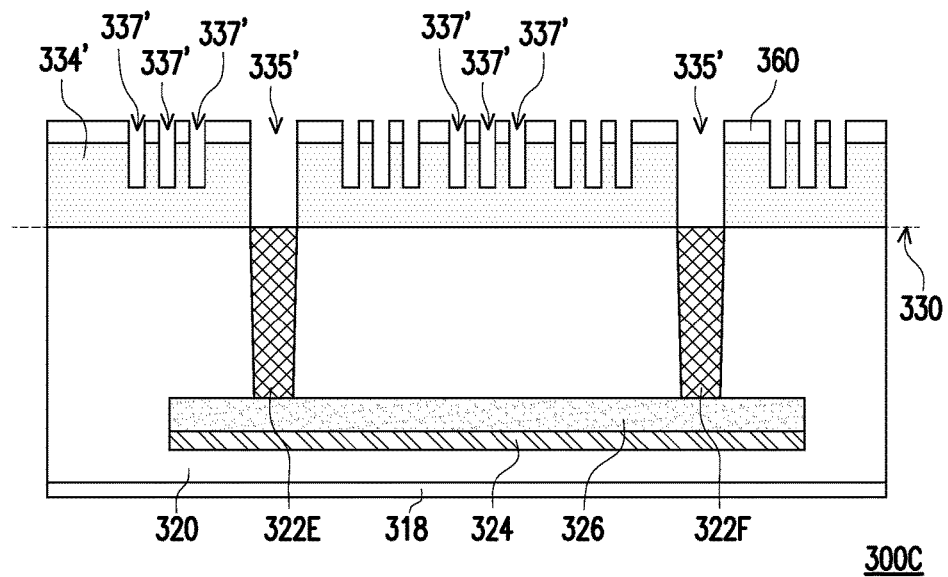

FIG. 3C is a cross-section of an inchoate version 300C of sub-structure 300F according to an embodiment. In some embodiments, the etch-mask features and the exposed portions of dielectric layer 334 are then subjected to etching using an etchant selectively tuned to remove the material from which dielectric layer 334 is formed but not the etch-mask features, thereby resulting in a version 334' of dielectric layer 334. Because the width of the narrow openings is narrower than the width of the regular openings, one etching process is sufficient to remove a lesser amount of dielectric layer 334 in regions corresponding to the narrow openings than in regions corresponding to the regular openings. As a result, recesses 335' are wider than recesses 337', and recesses 335' are deeper than recesses 337'. Ultimately (see FIG. 3F, discussed below), the shallower depth of recesses 337' will result in distance $D_{extra}$ between bottom surfaces of smaller segments S0" 338A-338C, 340A-340C, 342A-342C, 344A-344C, and 346A-346C (FIG. 3F) and the top surface of ILD1 320.

In some embodiments, the etching process is a wet etching, a dry etching, or a combination thereof. Such etching creates recesses 335' in dielectric layer 334' which expose contact plugs 322E and 322F. Recesses 335' are examples of first recesses which expose the first contacts, namely contact plugs 322E and 322F. Such etching also creates recesses 337' in dielectric layer 334'. Recesses 337' are examples of second recesses which do not expose corresponding underlying areas of ILD1 320. Accordingly, inchoate version 300C of sub-structure 300F is formed.

Figure 3D:
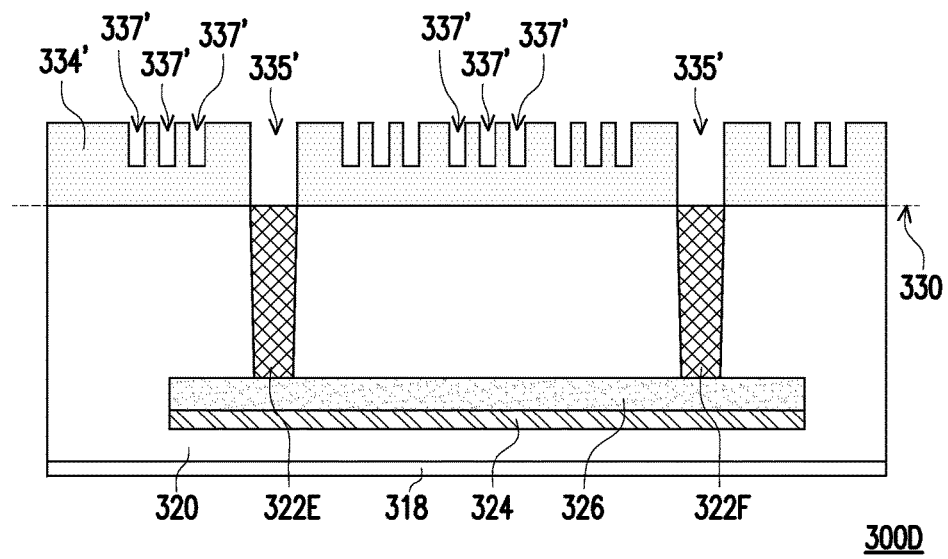

FIG. 3D is a cross-section of an inchoate version 300D of sub-structure 300F according to an embodiment. Exposed portions 360 of the photoresist layer are removed from dielectric layer 334'. In some embodiments, exposed portions 360 of the photoresist layer are removed using a suitable process, such as wet stripping or plasma ashing. Accordingly, inchoate version 300D of sub-structure 300F is formed.

Figure 3E:
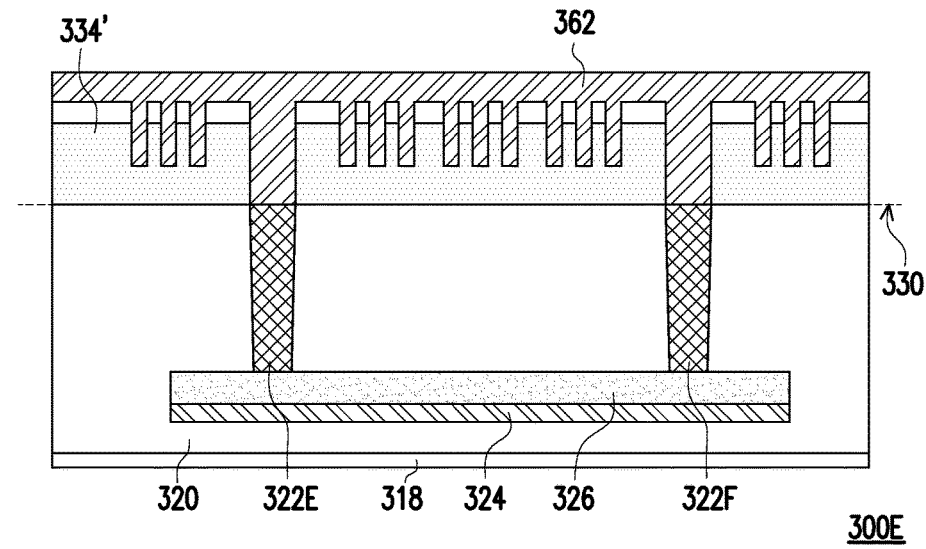
Figure 3F:
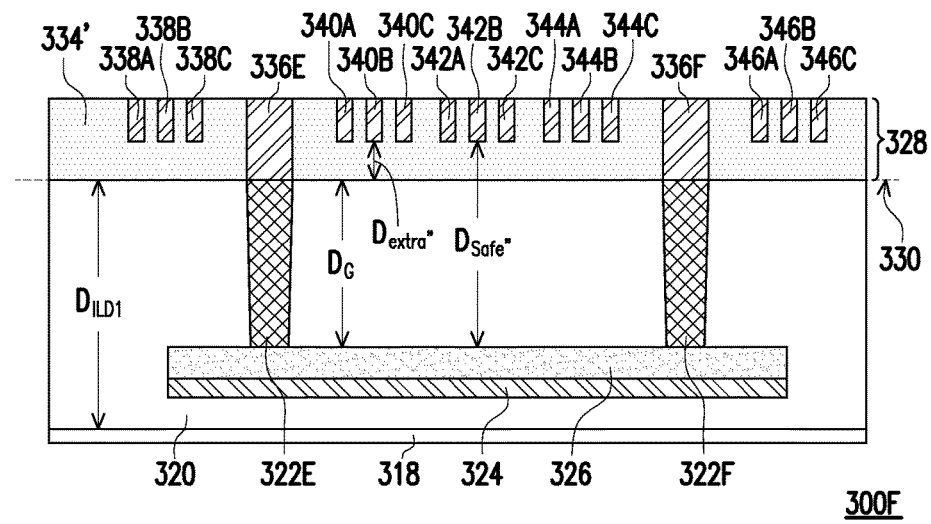

FIG. 3E is a cross-section of an inchoate version 300E of sub-structure 300F according to an embodiment. A layer 362 of conductive material is formed on dielectric layer 334'. In particular, recesses 335' and 337' of dielectric layer 334' are filled with the conductive material. In some embodiments, the conductive material of layer 362 is a metal. In some embodiments, the conductive material of layer 362 is aluminum, copper or tungsten. In some embodiments, layer 362 of conductive material may be formed of multiple sub-layers of conductive material. Then, a portion of layer 362 of conductive material is removed. In some embodiments, the portion of layer 362 of conductive material is removed using chemical mechanical polishing (CMP), thereby resulting in sub-structure 300F of FIG. 3F. In some embodiments, the CMP produces an approximately planar surface. Greater detail regarding the manufacture of interconnect layer 328 can be found in U.S. Pat. No. 7,354,856 granted/issued Apr. 8, 2008, and in U.S. Pat. No. 6,329,234 granted/issued Dec. 11, 2011, the entireties of each of which are hereby incorporated by reference.

FIG. 3F is a cross-section of sub-structure 300F according to an embodiment. Interconnect layer 328 is similar to interconnect layer 228 and sub-structure 300F is similar to a sub-structure 200F of interconnect layer 228 of FIGS. 2A-2C. Interconnect layer 328 includes regular line segments S0 336E and 336F and smaller line segments S0" 338A, 338B & 338C (338A-338C being arranged as a first set), 340A, 340B & 340C (340A-340C being arranged as a second set), 342A, 342B & 342C (342A-342C being arranged as a third set), 344A, 344B & 344C (344A-344C being arranged as a fourth set), and 346A, 346B & 346C (346A-346C being arranged as a fifth set).

In some embodiments, greater or fewer than three smaller line segments S0" are in some or all of the sets of smaller line segments. In some embodiments, other numbers of sets of smaller line segments are formed between regular line segments S0 336E and 336F. In some embodiments, greater or fewer than three smaller line segments S0" are in some or all of the sets of smaller line segments. In some embodiments, other numbers of sets of smaller line segments are formed between regular line segments S0 336E and 336F. In some embodiments, at least one other set of smaller line segments S0" is formed between regular line segments S0 336F and 336C, e.g., the fifth set including smaller line segments S0" 346A, 346B and 346C. In some embodiments, at least one other set of smaller line segments S0" (e.g., the first set including smaller line segments S0" 338A, 338B and 338C) is formed to a side of regular line segment S0 336E that is opposite to the side on which is located the second set (which includes smaller line segments S0" 340A, 340B and 340C).

In some embodiments, within a given set of smaller line segments S0", each of the smaller line segment S0" members represent the same conductive path, e.g., within the fourth set (which includes smaller line segments S0" 344A, 344B and 344C), each of smaller line segments S0" 344A, 344B and 344C represents the same conductive path. In some embodiments, the first through fifth sets of smaller line segments S0" represent at least one different conductive path than the first conductive path that includes regular line segments S0 336E and 336F. In some embodiments, the first through fifth sets of smaller line segments S0" represent correspondingly different second through sixth conductive paths relative to each other as well as relative to the first conductive path that includes regular line segments S0 336E and 336F.

In some embodiments, the various stages of manufacture of a sub-structure 300F' (not shown) are similar to substructure 300F (FIG. 3F) albeit appropriate to interconnect layer 128 of FIGS. 1B-1C. Accordingly, the various stages of manufacture of a sub-structure 300F' (not shown) are understood by adapting FIGS. 3A-3F. Such a sub-structure 300F' (not shown) includes a portion of ILD1 320 and a portion of an interconnect layer 328' (not shown). The portion of interconnect layer 328' (not shown) is similar to interconnect layer 328 and yet corresponds to interconnect layer 128.

Like interconnect layer 128, interconnect layer 328' includes sets of smaller line segments S0', wherein each smaller line segment S0' is thinner in thickness and narrower in width than a regular line segment S0. More particularly (and, like interconnect layer 128), each set of smaller line segments S0' in interconnect layer 328' includes four line segments S0'. Accordingly, each opening in the mask corresponding to a smaller line segment S0' is narrower in width than an opening corresponding to a regular mask segment S0. In some embodiments, the width $w_{s0}$ of the regular openings (corresponding to regular line segments S0) is about four times greater than the width $w_{s0'}$ is of the narrow openings (corresponding to smaller line segments S0') such that $w_{s0} \approx 4 * w_{s0'}$.

Figure 4:
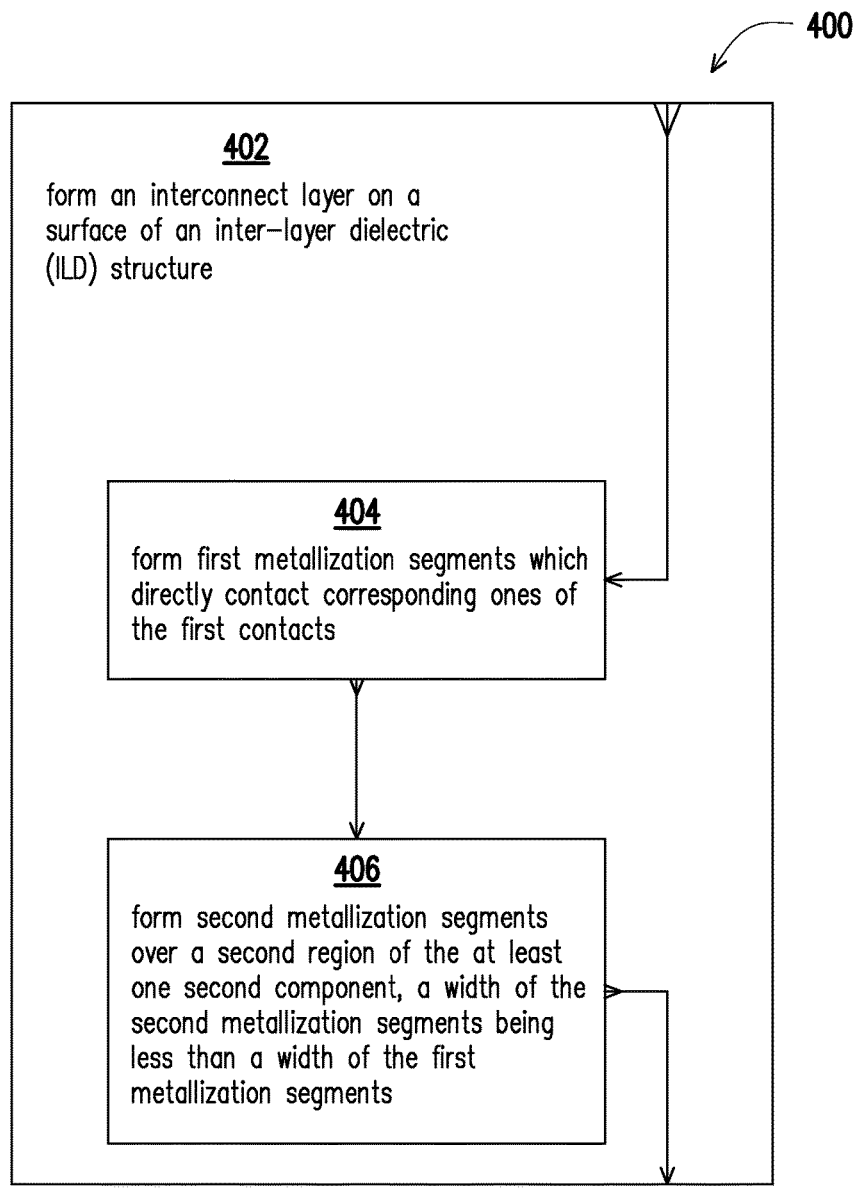
FIG. 4 is a flowchart of a method of manufacturing an interconnect layer for a semiconductor device in accordance with at least one embodiment of the present disclosure.

FIG. 4 is a flowchart of a method 400 of manufacturing an interconnect layer for a semiconductor device in accordance with at least one embodiment of the present disclosure.

It is understood that FIG. 4 has been simplified for a better understanding of the concepts of the present disclosure. Accordingly, it should be noted that additional processes may be provided before, during, and after the method of FIG. 4, and that some other processes may only be briefly described herein.

At block 402, an interconnect layer (e.g., interconnect layer 128 or 228) is formed on a surface of an inter-layer dielectric (ILD) structure (e.g., ILD1 120 or ILD1 220). In some embodiments, the ILD structure includes: first contacts (e.g., conductive plugs 122A and 122B or 222A and 222B), extending through the ILD structure, electrically connected to corresponding first components (e.g., source/drain regions 106A and 106B or 206A and 206b) of the semiconductor device; at least one second component (e.g., conductive plate 126 or 226) of the semiconductor device; and second contacts (e.g., conductive plugs 122E and 122F or 222E and 222F) directly contacting corresponding first regions of the at least one second component. In some embodiments, a spacing (e.g., gap distance $D_G$, in a direction perpendicular to a plane of the ILD structure) between the surface of the ILD structure and the at least one second component is less than a thickness (e.g., $D_{ILD1}$) of the ILD structure, e.g., $D_G < D_{ILD1}$.

In some embodiments, block 402 is implemented according to blocks 404 and 406. At block 404, first metallization segments (e.g., S0) are formed which directly contact corresponding ones of the first contacts. The flow proceeds to a block 406 in which second metallization segments (e.g., S0' or S0") are formed over a second region (e.g., regions 132 or 232) of the at least one second component. A width of the second metallization segments (e.g., width $w_{s0'}$ or width $w_{s0''}$) is less than a width (e.g., width $w_{s0}$) of the first metallization segments such that, e.g., $w_{s0'} < w_{s0}$ and/or $w_{s0''} < w_{s0}$.

Figure 5:
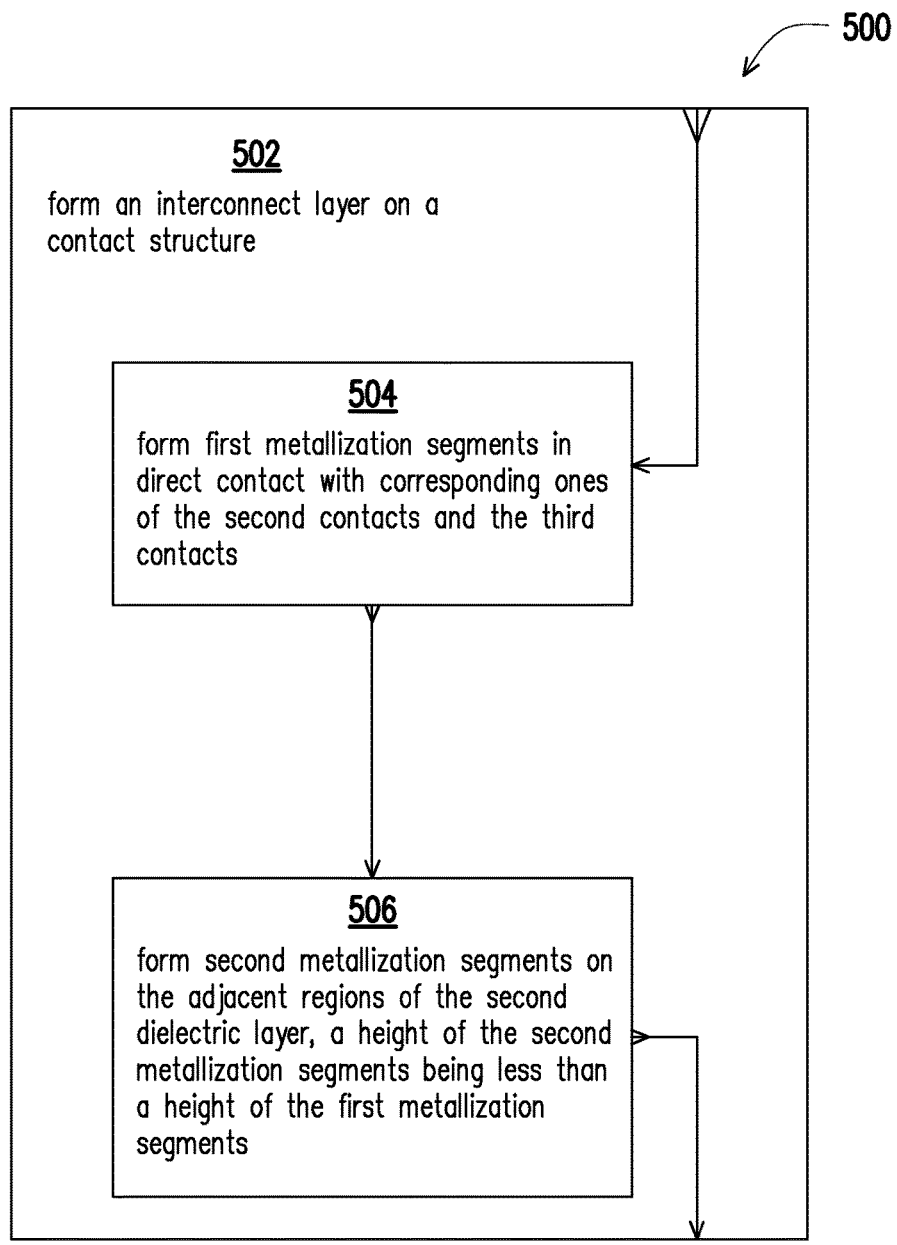
FIG. 5 is a flowchart of a method of manufacturing an interconnect layer for a semiconductor device in accordance with at least one embodiment of the present disclosure.

FIG. 5 is a flowchart of a method 500 of manufacturing an interconnect layer for a semiconductor device in accordance with at least one embodiment of the present disclosure.

It is understood that FIG. 5 has been simplified for a better understanding of the concepts of the present disclosure. Accordingly, it should be noted that additional processes may be provided before, during, and after the method of FIG. 5, and that some other processes may only be briefly described herein.

At block 502, an interconnect layer (e.g., interconnect layer 128 or 228) is formed on a contact structure (e.g., first floor 1F and second floor 2F taken together). In some embodiments, the contact structure includes: a first dielectric layer (e.g., ILD0 104 or 240) on a base layer (e.g., STI regions 102 or 202 and region 108 or 208), the base layer including first components (e.g., source/drain regions 106A and 106B or 206A or 206B) of the semiconductor device; first contacts (e.g., contact plugs 114A and 114B or 214A and 214B), arranged within the first dielectric layer, directly contacting corresponding components (e.g., source/drain regions 106A and 106B or 206A and 206B) of the semiconductor device; a second dielectric layer (e.g., ILD1 120 or 220) on the first dielectric layer; second contacts (e.g., conductive plugs 122E and 122F or 222E and 222F), arranged within the second dielectric layer, directly contacting corresponding ones of the first contacts; at least one second component (e.g., conductive plate 126 or 226) of the semiconductor device arranged within the second dielectric layer; and third contacts (e.g., conductive plugs 122E and 122F or 222E and 222F), arranged within the second dielectric layer, directly contacting corresponding ones of the second components. In some embodiments, a height (e.g., gap distance $D_G$, in a direction perpendicular to a plane of the ILD structure) of the third contacts is less than a height (e.g., $D_{ILD}$) of the second contacts, e.g., $D_G < D_{ILD1}$. As such, the height of the third contacts otherwise renders adjacent regions (e.g., regions 132 or 232) of the second dielectric layer susceptible to dielectric breakdown.

In some embodiments, block 502 is implemented according to blocks 504 and 506. At block 504, first metallization segments (e.g., S0) are formed in direct contact with corresponding ones of the second contacts and the third contacts. The flow proceeds to block 506 in which second metallization segments (e.g., S0' or S0") are formed on the adjacent regions (e.g., regions 132 or 232) of the second dielectric layer, a height ($h_{s0'}$ or $h_{s0''}$) of the second metallization segments is less than a height ($h_{s0}$) of the first metallization segments such that, e.g., $h_{s0'} < h_{s0}$ and/or $h_{s0''} < h_{s0}$.

One aspect of this description relates to a semiconductor device. Such a semiconductor device includes: an inter-layer dielectric (ILD) structure and an interconnect layer. Such an ILD structure includes: first contacts, extending through the ILD structure, electrically connected to corresponding first components of the semiconductor device, the first components being located in a floor structure underlying the ILD structure; at least one second component of the semiconductor device, the at least one second component being located within the ILD structure and spaced from a surface of the ILD structure (in a direction perpendicular to a plane of the ILD structure) a distance which is less than a thickness of the ILD structure; and second contacts directly contacting corresponding first regions of the at least one second component. Such an interconnect layer includes: first metallization segments which directly contact corresponding ones of the first contacts; and second metallization segments located over a second region of the at least one second component, a width of the second metallization segments being less than a width of the first metallization segments.

Another aspect of this description relates to a method of manufacturing a semiconductor device. Such a method includes: forming an interconnect layer on a surface of an inter-layer dielectric (ILD) structure. Such an ILD structure includes: first contacts, extending through the ILD structure, electrically connected to corresponding first components located in floor structure underlying the ILD structure; at least one second component of the semiconductor device; the at least one second component being spaced from a surface of the ILD structure (in a direction perpendicular to a plane of the ILD structure) a distance which is less than a thickness of the ILD structure; and second contacts directly contacting corresponding first regions of the at least one second component. Such forming of the interconnect layer includes: forming first metallization segments which directly contact corresponding ones of the first contacts; and forming second metallization segments over a second region of the at least one second component, a width of the second metallization segments being less than a width of the first metallization segments.

Yet another aspect of this description relates to a method of manufacturing a semiconductor device. Such a method includes: forming an interconnect layer on a contact structure. Such a contact structure includes: a first dielectric layer on a base layer, the base layer including first components of the semiconductor device; first contacts, arranged within the first dielectric layer, directly contacting corresponding ones of the first components; a second dielectric layer on the first dielectric layer; second contacts, arranged within the second dielectric layer, directly contacting corresponding ones of the first contacts; at least one second component of the semiconductor device arranged within the second dielectric layer; and third contacts, arranged within the second dielectric layer, directly contacting corresponding ones of the at least one second component, a height of the third contacts being less than a height of the second contacts, the height of the third contacts otherwise rendering adjacent regions of the second dielectric layer susceptible to dielectric breakdown. The heights of the contacts are in a direction perpendicular to a plane of the substrate. Such forming of the interconnect layer includes: forming first metallization segments in the second dielectric layer so as to be in direct contact with corresponding ones of the second contacts and the third contacts; and forming second metallization segments in the adjacent regions of the second dielectric layer such that portions of the second dielectric layer are interposed, relative to the reference direction, between the second metallization segments and the first dielectric layer.

One of ordinary skill in the art would recognize that operations are able to be removed or that additional operations are able to be added to at least one of the above-noted methods without departing from the scope of this description. One of ordinary skill in the art would also recognize that an order of operations in at least one of the above-noted methods is able to be adjusted without departing from the scope of this description.

While the present disclosure has been described in the context of the embodiments explicitly discussed herein, those skilled in the art will appreciate that the present disclosure is capable of being implemented and distributed in the form of a computer-usable medium (in a variety of forms) containing computer-executable instructions, and that the present disclosure applies equally regardless of the particular type of computer-usable medium which is used to carry out the distribution. An exemplary computer-usable medium is coupled to a computer such the computer can read information including the computer-executable instructions therefrom, and (optionally) write information thereto. Alternatively, the computer-usable medium may be integral to the computer. When the computer-executable instructions are loaded into and executed by the computer, the computer becomes an apparatus for practicing the disclosure. For example, when the computer-executable instructions are loaded into and executed by a general-purpose computer, the general-purpose computer becomes configured thereby into a special-purpose computer. Examples of suitable non-transitory computer-usable media include: volatile memory such as random access memory (RAM); nonvolatile, hard-coded or programmable-type media such as read only memories (ROMs) or erasable, electrically programmable read only memories (EEPROMs); recordable-type and/or re-recordable media such as floppy disks, hard disk drives, compact discs (CDs) and/or digital versatile discs (DVDs).

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   an inter-layer dielectric (ILD) structure including:
      first contacts, extending through the ILD structure, electrically connected to corresponding first components of the semiconductor device, the first components being located in a floor structure underlying the ILD structure;
      at least one second component of the semiconductor device,
         the at least one second component being located within the ILD structure and spaced from a surface of the ILD structure, in a direction perpendicular to a plane of the surface of the ILD structure, a distance which is less than a thickness of the ILD structure; and
      second contacts directly contacting corresponding first regions of the at least one second component; and
   an interconnect layer, on the ILD structure, including:
      a lower surface, wherein the lower surface of the interconnect layer is over an upper surface of the second contacts;
      first metallization segments which directly contact corresponding ones of the first contacts; and
      second metallization segments having a lower surface, and located over a second region of the at least one second component, a width of the second metallization segments being less than a width of the first metallization segments, wherein the lower surface of the second metallization segments is over the lower surface of the interconnect layer.

2. The semiconductor device of claim 1, wherein:
   the width of at least one of the first metallization segments is approximately three to four times greater than the width of each second metallization segment.

3. The semiconductor device of claim 1, wherein:
a thickness of each of the second metallization segments is less than a thickness of each of the first metallization segments.

4. The semiconductor device of claim 3, wherein:
for each second metallization segment, a thickness/height ($h_{s2}$) relates to a width ($w_{s2}$) as follows:

$$h_{s2} \propto 1/w_{s2}.$$

5. The semiconductor device of claim 3, wherein:
for each second metallization segment, the thickness/height $h_{s2}$ relates to the width $w_{s2}$ as follows:

$$h_{s2} = \beta * w_{s2}$$

where $\beta$ is a positive real number, and where $(\approx 1.5) \leq \beta \leq (\approx 2.0)$.

6. The semiconductor device of claim 1, wherein:
the first metallization segments extend completely through the interconnect layer; and
the second metallization segments extend into the interconnect layer from the surface of the interconnect layer but do not extend completely through the interconnect layer.

7. The semiconductor device of claim 1, wherein:
the first components of the semiconductor device include components of a MOS transistor; and
the at least one second component of the semiconductor device is a resistor.

8. The semiconductor device of claim 7, wherein:
the resistor includes a layer of titanium nitride.

9. A method of manufacturing a semiconductor device, the method comprising:
forming an interconnect layer on a surface of an interlayer dielectric (ILD) structure wherein the interconnect layer is formed to include a lower surface;
wherein the ILD structure includes:
first contacts, extending through the ILD structure, electrically connected to corresponding first components located in a floor structure underlying the ILD structure;
at least one second component located within the ILD structure,
the at least one second component being spaced from the surface of the ILD structure, in a direction perpendicular to a plane of the surface of the ILD structure, a distance which is less than a thickness of the ILD structure; and
second contacts directly contacting corresponding first regions of the at least one second component, wherein the lower surface of the interconnect layer is over an upper surface of the second contacts; and
wherein the forming the interconnect layer includes:
forming first metallization segments which directly contact corresponding ones of the first contacts; and
forming second metallization segments over a second region of the at least one second component, wherein the second metallization segments have a lower surface over the lower surface of the interconnect layer, and a width of the second metallization segments being less than a width of the first metallization segments.

10. The method of claim 9, wherein:
the width of at least one of the first metallization segments is approximately three to four times greater than the width of each second metallization segment.

11. The method of claim 9, wherein:
a thickness of at least one of the second metallization segments is less than a thickness of at least one of the first metallization segments; and
for each second metallization segment, a thickness/height ($h_{s2}$) relates to a width ($w_{s2}$) as follows:

$$h_{s2} \propto 1/w_{s2}.$$

12. The method of claim 9, wherein:
for each second metallization segment, a width ($w_{s2}$) relates to a thickness/height ($h_{s2}$) as follows:

$$h_{s2} = \beta * w_{s2}$$

where $\beta$ is a positive real number.

13. The method of claim 9, wherein:
the first metallization segments extend completely through the interconnect layer; and
the second metallization segments extend into the interconnect layer from the surface of the interconnect layer but do not extend completely through the interconnect layer.

14. The method of claim 9, wherein:
the first components of the semiconductor device include components of a MOS transistor; and
the at least one second component of the semiconductor device is a high-resistance component.

15. The method of claim 14, wherein the high-resistance component includes:
a layer of titanium nitride.

16. The method of claim 9, wherein the forming the interconnect layer includes:
depositing a dielectric layer on the ILD structure;
removing first portions of the dielectric layer thereby to form first recesses which expose the first contacts and second contacts;
removing second portions of the dielectric layer in some areas over the second region of the at least one second component thereby to form second recesses which do not expose corresponding areas of the ILD structure; and
filling the first and second recesses with a conductive material.

17. A method of manufacturing a semiconductor device, the method comprising:
forming an interconnect layer on a contact structure;
wherein the contact structure includes:
a first dielectric layer on a base layer, the base layer including first components of the semiconductor device;
first contacts, arranged within the first dielectric layer, directly contacting corresponding ones of the first components;
a second dielectric layer on the first dielectric layer;
second contacts, arranged within the second dielectric layer, directly contacting corresponding ones of the first contacts;
at least one second component arranged within the second dielectric layer; and
third contacts, arranged within the second dielectric layer, directly contacting corresponding ones of the at least one second component, a height of the third contacts being less than a height of the second contacts, the height of the third contacts rendering adjacent regions of the second dielectric layer less susceptible to dielectric breakdown than would third contacts having a height equal to or greater than the height of the second contacts;

wherein the heights of the contacts are in a reference direction perpendicular to a plane of the surface of the contact structure on which the interconnect layer is formed;

wherein the forming the interconnect layer includes:

forming first metallization segments in the second dielectric layer so as to be in direct contact with corresponding ones of the second contacts and the third contacts; and forming second metallization segments in the adjacent regions of the second dielectric layer such that portions of the second dielectric layer are interposed, relative to the reference direction, between the second metallization segments and the first dielectric layer.

18. The method of claim 17, wherein:

the width of at least one of the first metallization segments is approximately three to four times greater than the width of each second metallization segment;

a height of the second metallization segments is less than a height of the first metallization segments; and for each second metallization segment, a thickness/height ($h_{s2}$) relates to a width ($w_{s2}$) as follows:

$$h_{s2} \propto 1/w_{s2}.$$

19. The method of claim 17, wherein:

the first metallization segments extend completely through the interconnect layer; and the second metallization segments extend only partially into the interconnect layer but do not extend completely through the interconnect layer.

20. The method of claim 17, wherein:

the components of the semiconductor device include components of MOS transistors; and the second components of the semiconductor device are resistors.

* * * * *